United States Patent
Chang

(10) Patent No.: US 10,806,051 B2
(45) Date of Patent: Oct. 13, 2020

(54) HEAT SINK AND ELECTRONIC DEVICE USING SAME

(71) Applicant: Chiun Mai Communication Systems, Inc., New Taipei (TW)

(72) Inventor: Yu-Wei Chang, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 16/516,347

(22) Filed: Jul. 19, 2019

(65) Prior Publication Data

US 2020/0029467 A1 Jan. 23, 2020

(30) Foreign Application Priority Data

Jul. 20, 2018 (CN) .......................... 2018 1 0805630

(51) Int. Cl.
| | |
|---|---|
| *H05K 7/20* | (2006.01) |
| *H05K 5/00* | (2006.01) |
| *H05K 9/00* | (2006.01) |
| *H05K 5/03* | (2006.01) |
| *H05K 5/04* | (2006.01) |

(52) U.S. Cl.
CPC ....... *H05K 7/20336* (2013.01); *H05K 5/0004* (2013.01); *H05K 5/0017* (2013.01); *H05K 5/0086* (2013.01); *H05K 5/03* (2013.01); *H05K 5/04* (2013.01); *H05K 7/2039* (2013.01); *H05K 9/0049* (2013.01)

(58) Field of Classification Search
CPC . H01L 23/427; H01L 51/0048; H01L 51/444; F28D 15/0233; G06F 1/203; G06F 2200/201; G06F 1/20; H05K 7/20336; H05K 1/0203; H05K 7/20309; H05K 7/2039; H05K 7/20936; H05K 5/0017; H05K 9/0049; H05K 5/03; H05K 5/0004; H05K 5/0086; H05K 5/04; H05K 1/0201
See application file for complete search history.

(56) References Cited

U.S. PATENT DOCUMENTS

| | | | |
|---|---|---|---|
| 6,871,701 B2* | 3/2005 | Ueki | F28D 15/0233 165/104.26 |
| 2002/0056908 A1* | 5/2002 | Brownell | F28D 15/0266 257/714 |
| 2008/0174963 A1* | 7/2008 | Chang | F28D 15/0233 361/700 |

(Continued)

FOREIGN PATENT DOCUMENTS

| | | | |
|---|---|---|---|
| CN | 105828570 A | 8/2016 | |
| TW | M476251 U | 4/2014 | |
| WO | WO-2018101321 A1 * | 6/2018 | .............. H04M 1/02 |

*Primary Examiner* — Adam B Dravininkas
(74) *Attorney, Agent, or Firm* — ScienBiziP, P.C.

(57) ABSTRACT

A heat sink allowing a reduced thickness of an electronic device includes a housing, a wick structure, and a heat transfer fluid. The housing, comprising an upper housing and a lower housing, are opposite and form a sealed cavity. The wick structure and the heat transfer fluid are received in the cavity, the liquid absorbing heat and becoming gaseous upon reaching a certain temperature. The area of the upper housing is larger than the area of the lower housing. The upper housing forms a protrusion with respect to an edge of the lower housing. An electronic device using the heat sink is also provided.

5 Claims, 3 Drawing Sheets

(56) References Cited

U.S. PATENT DOCUMENTS

| | | | | |
|---|---|---|---|---|
| 2010/0139894 A1* | 6/2010 | Zhou | F28D 15/046 | 165/104.26 |
| 2011/0108243 A1* | 5/2011 | Hou | F28D 15/046 | 165/104.26 |
| 2011/0192004 A1* | 8/2011 | Wang | B01B 1/00 | 29/428 |
| 2011/0192876 A1* | 8/2011 | Wilson | A45F 3/02 | 224/587 |
| 2011/0240264 A1* | 10/2011 | Wang | B23P 15/26 | 165/104.26 |
| 2014/0076995 A1* | 3/2014 | Wang | G06F 1/20 | 239/145 |
| 2016/0037681 A1* | 2/2016 | Lee | H04B 1/036 | 455/556.1 |
| 2016/0135331 A1* | 5/2016 | Wu | G06F 3/041 | 361/700 |
| 2018/0177077 A1* | 6/2018 | Shioga | H01L 23/427 | |
| 2019/0281729 A1* | 9/2019 | Inagaki | G06F 1/20 | |

* cited by examiner

HEAT SINK AND ELECTRONIC DEVICE USING SAME

FIELD

The disclosure generally relates to heat sink and electronic device using same.

BACKGROUND

VC (Vapor Chamber) is widely used in electronic devices for better heat transfer. However, the VC is mostly installed on the electronic device by additional fastening components, which add on to the thickness of the electronic device. A heat sink in an electronic devise without adding the total thickness of the electronic device may be desire.

BRIEF DESCRIPTION OF THE DRAWINGS

Implementations of the present disclosure will now be described, by way of embodiments, with reference to the attached figures.

DETAILED DESCRIPTION

Figure 1:
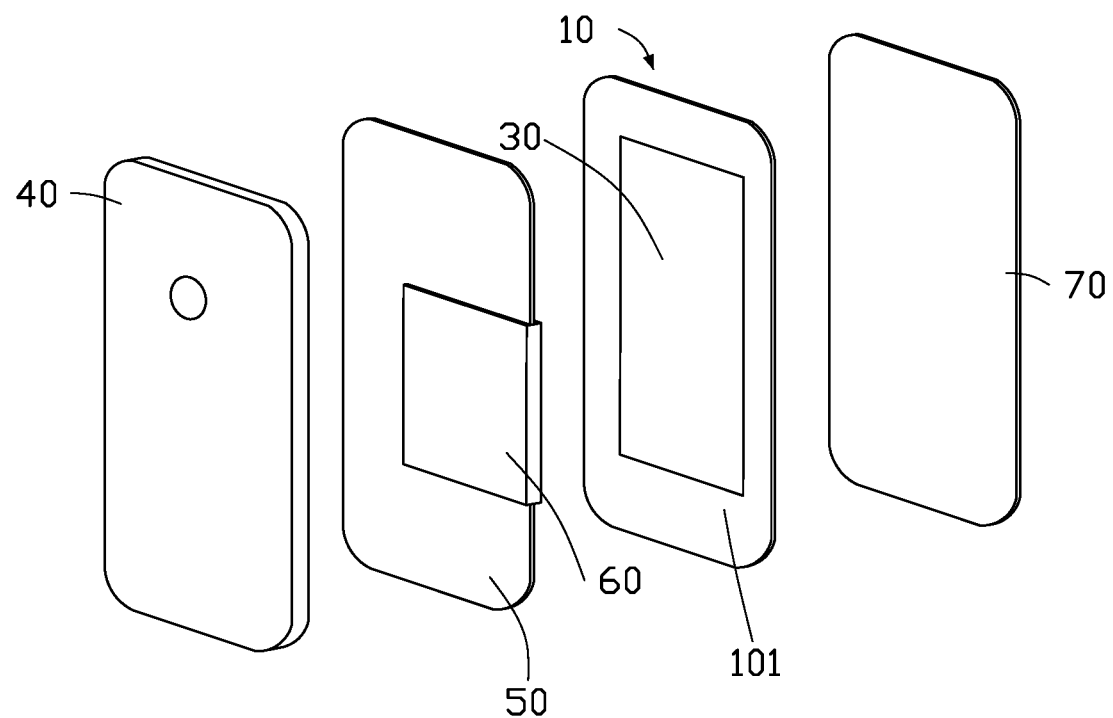
FIG. 1 is an exploded perspective view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures, and components have not been described in detail so as not to obscure the related relevant feature being described. Further, the description is not to be considered as limiting the scope of the embodiments described herein. The drawings are not necessarily to scale and the proportions of certain parts may be exaggerated to better illustrate details and features of the present disclosure.

The term "comprising" when utilized, means "include, but is not limited to"; it specifically indicates open-ended inclusion or membership in the so-described combination, group, series, and the like. The term "coupled" when utilized, means "either a direct electrical connection between the things that are connected, or an indirect connection through one or more passive or active intermediary devices, but is not limited to".

FIG. 1 illustrates an embodiment of an electronic device 100. The electronic device 100 can be, but is not limited to, a mobile phone, a tablet, a smart watch, or the like. In this embodiment, the electronic device 100 is a mobile phone.

The electronic device 100 at least includes a back cover 40, a circuit board 50, a battery 60, a middle frame 10, a heat sink 30, and a display screen 70. The heat sink 30 is embedded in the middle frame 10. The circuit board 50 and the battery 60 are positioned adjacent to each other. The circuit board 50 and the battery 60 are positioned between the back cover 40 and the middle frame 10. The circuit board 50 and the battery 60 are positioned between the back cover 40 and the heat sink 30. The middle frame 10 and the heat sink 30 are positioned between the circuit board 50 and the display screen 70. The middle frame 10 and the heat sink 30 are positioned between the battery 60 and the display screen 70.

The electronic device 100 further includes, but is not limited to, an antenna, a camera, or the like.

Figure 2:
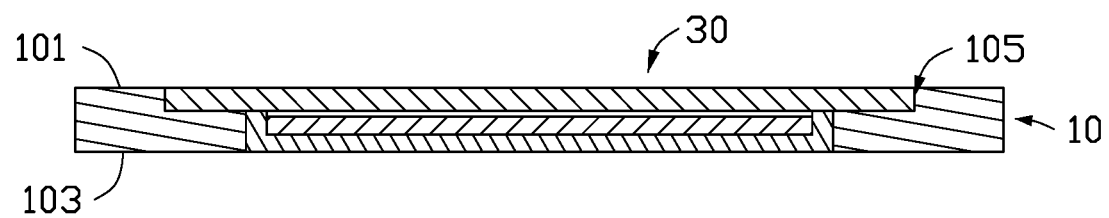
FIG. 2 is a cross-sectional view of a middle frame and a heat sink of the electronic device in FIG. 1.

Referring to FIG. 2, the middle frame 10 includes a first surface 101 and a second surface 103. The first surface 101 and the second surface 103 are on two opposite sides of the middle frame 10. The first surface 101 faces the circuit board 50, and the second surface 103 faces the display screen 70. In this embodiment, the middle frame 10 further includes a groove 105. The groove 105 extends through the first surface 101 and the second surface 103. The groove 105 is used to receive the heat sink 30. In another embodiment, the groove 105 extends through the first surface 101 or the second surface 103.

The middle frame 10 supports the display screen 70, provides a ground plane, performs electromagnetic shielding, and improves the structural strength of the electronic device 100.

Figure 3:
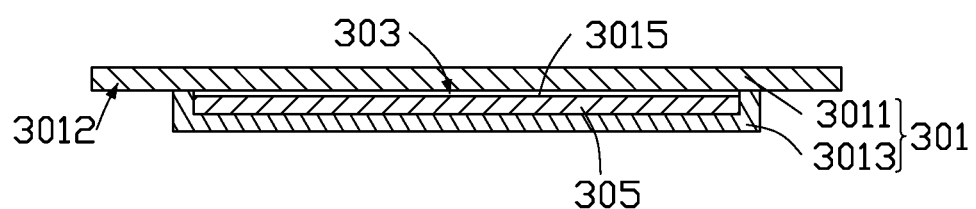
FIG. 3 is a cross-sectional view of the heat sink of the electronic device in FIG. 1.

Referring to FIG. 3, the heat sink 30 at least includes a housing 301, a heat transfer fluid 303, and a wick structure 305. The heat sink 30 assists heat transfer from a heat component such as an IC (Integrated Circuit) or a battery 60 in the electronic device 100, to improve the running performance of the electronic device 100. The IC can be a CPU (Central Processing Unit), an RFIC (Radio Frequency Integrated Circuit), a PMIC (Power Management IC), or the like. In this embodiment, the IC is positioned on the circuit board 50, and the IC and the battery 60 are in close contact with the heat sink 30.

The housing 301 is made of a metal material. The housing 301 includes an upper housing 3011 and a lower housing 3013. The upper housing 3011 and the lower housing 3013 are oppositely positioned and sealed to form a cavity 3015. The upper housing 3011 and the lower housing 3013 can be connected together by welding, bonding, or the like.

In another embodiment, the upper housing 3011 and the lower housing 3013 are integrally molded to form the housing 301 having the cavity 3015.

In this embodiment, an area of the upper housing 3011 is larger than an area of the lower housing 3013. As such, when the lower housing 3013 and the upper housing 3011 are connected together, the upper housing 3011 forms a protrusion 3012 with respect to an edge of the lower housing 3013. The protrusion 3012 is a part of the upper housing 3011.

The housing 301 is received in the groove 105 of the middle frame 10.

Referring to FIG. 2 again, the groove 105 defines a stepped cross section, and the stepped cross section of the groove 105 is matched to a structure of the housing 301. The housing 301 is received in and recessed into the groove 105 to keep a thickness of the middle frame 10 uniform, without increasing a thinness of the electronic device 100. A surface of the upper housing 3011 away from the lower housing 3013 is flush with the first surface 101, and a surface of the lower housing 3013 away from the upper housing 3011 is flush with the second surface 103. The protrusion 3012 is embedded in the stepped structure of the groove 105. The heat sink 30 is assembled to the middle frame 10 by glue, double-sided tape, or by welding without using additional fastening elements such as screws.

The heat transfer fluid 303 is received in the cavity 3015. The heat transfer fluid 303 can convert between gas phase and liquid phase at a certain temperature to realize heat dissipating function of the heat sink 30. The heat transfer fluid 303 absorbs heat in converting from the liquid phase to the gas phase, and the heat transfer fluid 303 dissipates heat by diffusion of an evaporated gas in the cavity 3015. The evaporated gas is the heat transfer fluid 303 in gas phase.

The wick structure 305 is received in the cavity 3015 and positioned on at least one of the upper housing 3011 and the lower housing 3013. The wick structure 305 is configured to guide the heat transfer fluid 303 in liquid phase in the cavity 3015 for backflow by capillary action. The wick structure 305 can be a foam.

In summary, the housing 3011 of the heat sink 30 is formed by combining the upper housing 3011 and the lower housing 3013 of different sizes. The upper housing 3011 forms the protrusion 3012 with respect to an edge of the lower housing 3013. The protrusion 3012 is embedded in the stepped structure of the groove 105, so that the heat sink 30 can be assembled to the middle frame 10 by glue, double-sided tape, or by welding without additional fastening elements. Assembly time for assembling the heat sink 30 to the electronic device 100 is reduced and production efficiency improved. The heat sink 30 in the groove 105 maintains the thickness of the middle frame 10, without adding the thinness of the electronic device 100.

It is to be understood, however, that even through numerous characteristics and advantages of the present disclosure have been set forth in the foregoing description, together with details of assembly and function, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:

1. An electronic device comprising:
   a heat sink comprising:
      a housing, wherein the housing comprises an upper housing and a lower housing, the upper housing and the lower housing are oppositely positioned and sealed to form a cavity, an area of the upper housing is larger than an area of the lower housing, the upper housing forms a protrusion with respect to an edge of the lower housing;
      a wick structure in the cavity;
      a heat transfer fluid in the cavity;
   a middle frame, wherein the middle frame comprises a first surface and a second surface, the first surface and the second surface are on two opposite sides of the middle frame, the middle frame comprises a groove extending through the first surface and the second surface, the heat sink is received in the groove, a surface of the upper housing away from the lower housing is flush with the first surface, a surface of lower housing away from the upper housing is flush with the second surface.

2. The electronic device of claim 1, wherein the groove defines a stepped cross section configured to match the housing of the heat sink such that the heat sink is received in and recessed into the groove of the middle frame.

3. The electronic device of claim 2, wherein the protrusion is embedded in the stepped structure of the groove, and the heat sink is assembled to the middle frame.

4. The electronic device of claim 1, wherein the middle frame comprises a first surface and a second surface, the first surface and the second surface are on two opposite sides of the middle frame, the groove extends through one of the first surface and the second surface.

5. The electronic device of claim 1, the electronic device further comprises a back cover, a battery, a circuit board and a display screen, the heat sink is embedded in the middle frame, the circuit board and the battery are position adjacent to each other, the circuit board and the battery are positioned between the back cover and the middle frame, the circuit board and the battery are positioned between the back cover and the heat sink, the middle frame and the heat sink are positioned between the circuit board and the display screen, the middle frame and the heat sink are positioned between the battery and the display screen.

\* \* \* \* \*